United States Patent
Tunaboylu et al.

(10) Patent No.: US 7,637,006 B2
(45) Date of Patent: Dec. 29, 2009

(54) BEAM ASSEMBLY METHOD FOR LARGE AREA ARRAY MULTI-BEAM DUT PROBE CARDS

(75) Inventors: Bahadir Tunaboylu, Chandler, AZ (US); Horst Clauberg, Warminster, PA (US); John McGlory, Chandler, AZ (US); Anh-Tai Thai Nguyen, Gilbert, AZ (US)

(73) Assignee: SV Probe Pte. Ltd., Singapore (SG)

( * ) Notice: Subject to any disclaimer, the term of this patent is extended or adjusted under 35 U.S.C. 154(b) by 243 days.

(21) Appl. No.: 11/713,956

(22) Filed: Feb. 27, 2007

(65) Prior Publication Data

US 2007/0251080 A1    Nov. 1, 2007

Related U.S. Application Data

(60) Provisional application No. 60/777,076, filed on Feb. 27, 2006.

(51) Int. Cl.
*H05K 3/20* (2006.01)
*G01R 31/02* (2006.01)

(52) U.S. Cl. .......................... 29/831; 324/754
(58) Field of Classification Search .................. 29/831, 29/830, 846, 842, 874, 876, 884; 324/754; 439/67
See application file for complete search history.

(56) References Cited

U.S. PATENT DOCUMENTS 6,657,448 B2 *  12/2003  Hasegawa ................... 324/762

| | | | |
|---|---|---|---|
| 2001/0016437 A1 | 8/2001 | Hasegawa | |
| 2002/0014704 A1* | 2/2002 | Horie | 257/779 |
| 2002/0053734 A1* | 5/2002 | Eldridge et al. | 257/724 |
| 2003/0113990 A1 | 6/2003 | Grube et al. | |

(Continued)

FOREIGN PATENT DOCUMENTS

WO    WO 2005/122240 A1    12/2005

OTHER PUBLICATIONS

European Patent Office, "Notification of Transmittal of the International Search Report and the Written Opinion of the International Searching Authority, or the Declaration", International application No. PCT/US2007/005145, dated Oct. 4, 2007, 13 pages.

(Continued)

*Primary Examiner*—John C Hong
(74) *Attorney, Agent, or Firm*—Hickman Palermo Truong & Becker LLP; Edward A. Becker

(57) ABSTRACT

A method for fabricating beams for a probe card includes dividing a large beam panel into smaller sub-panels before attaching the beams to corresponding posts on a substrate. Each sub-panel may have a sufficient number of beams to test several devices under test. The beam sub-panels may be aligned to the space transformer using alignment fiducials on the beam sub-panels that correspond to opposing alignment features formed in the space transformer or other substrate. Special tie-bars may be formed between: (1) rows, for example, of beams and the frame/frame splines (i.e., quadrant tie-bars); and (2) adjacent beams within any such rows on the beam panel (i.e., beam tie-bars). The approach may also include the use of tip tie-bars and/or tail tie-bars.

17 Claims, 12 Drawing Sheets

U.S. PATENT DOCUMENTS

2004/0163252 A1* 8/2004 Khandros et al. ............. 29/884
2005/0162179 A1 7/2005 Hosaka et al.
2005/0179456 A1* 8/2005 Beaman et al. ............. 324/754

OTHER PUBLICATIONS

Claims, International application No. PCT/US2007/005145, 4 pages.

* cited by examiner

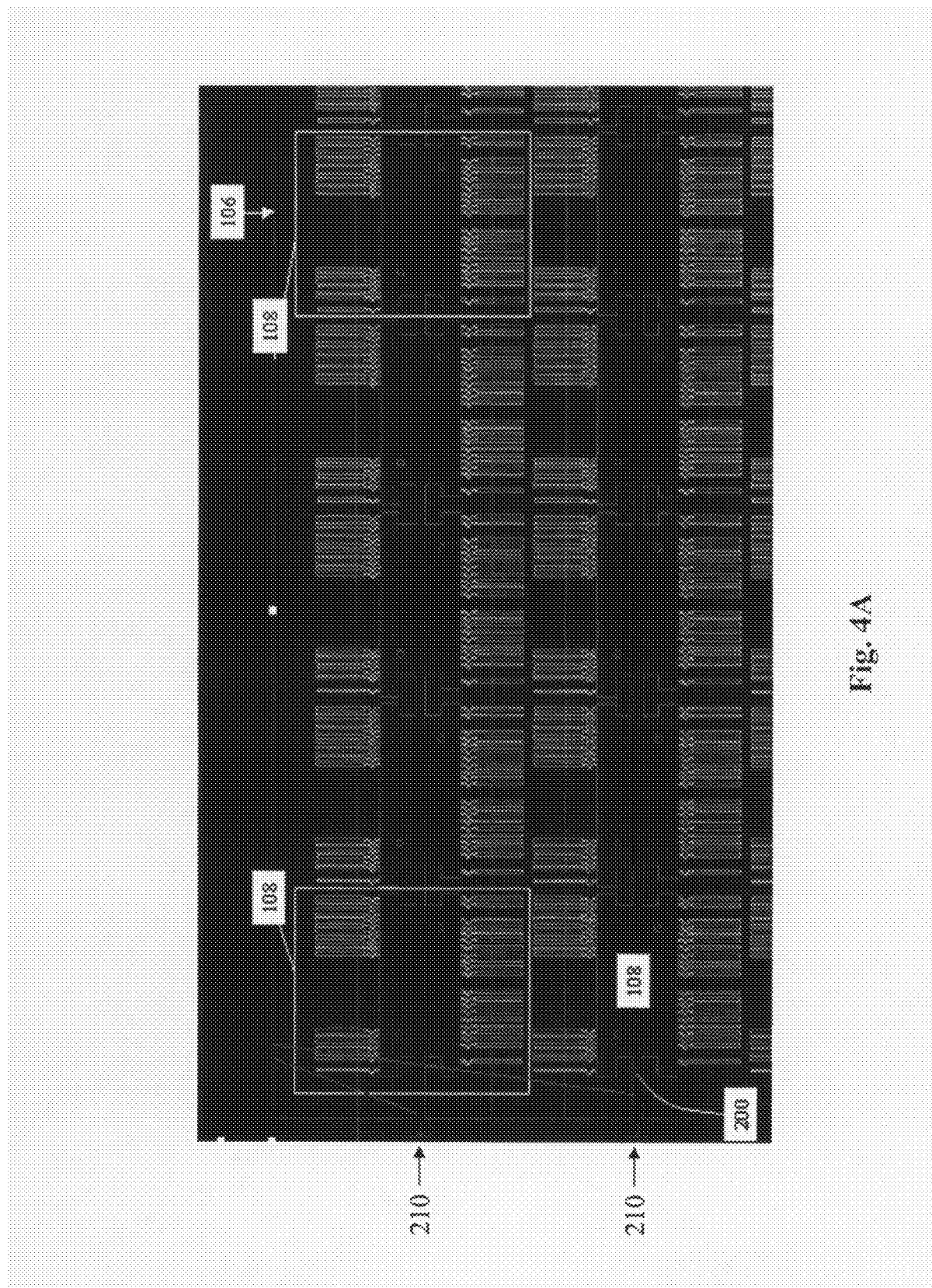

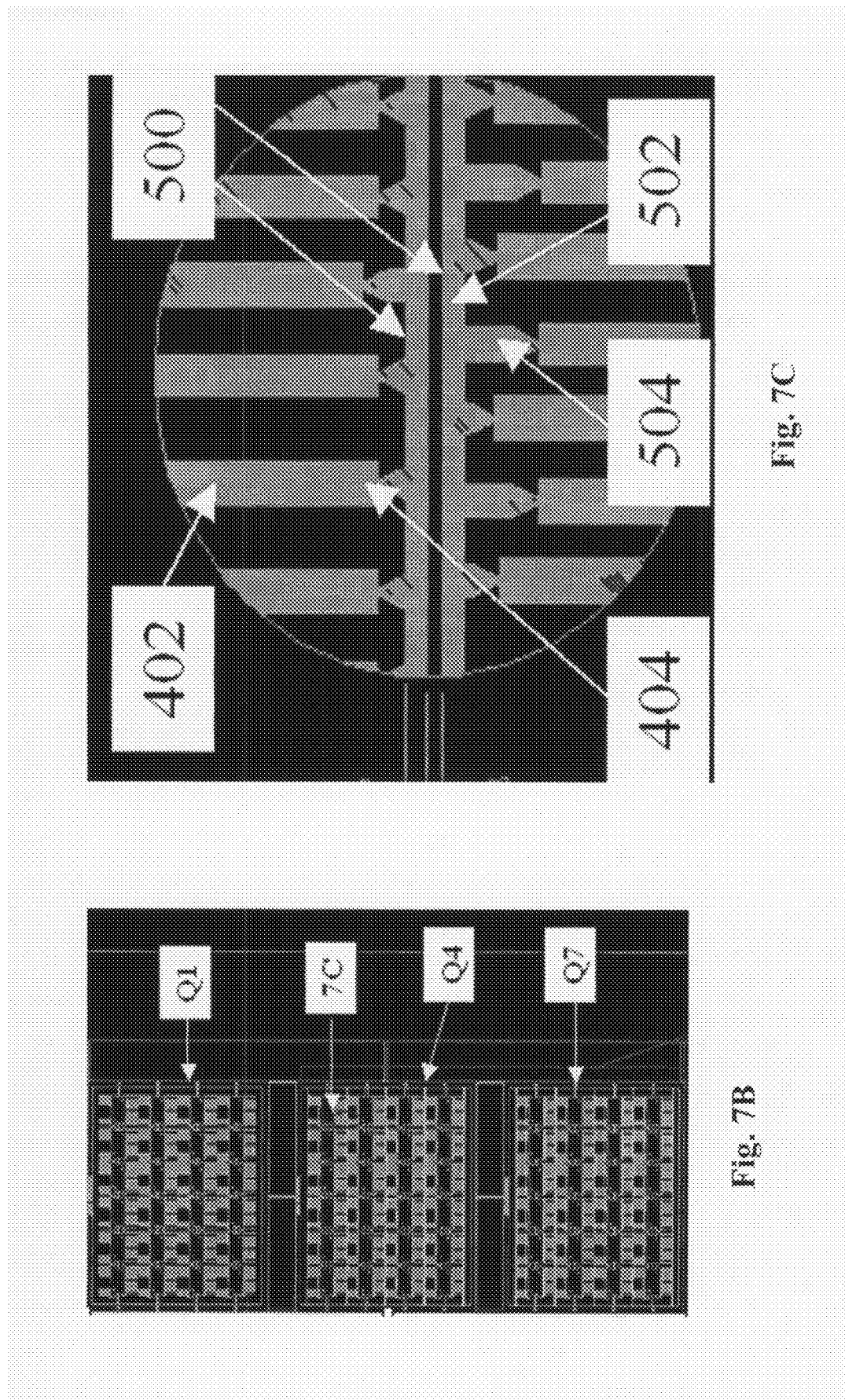

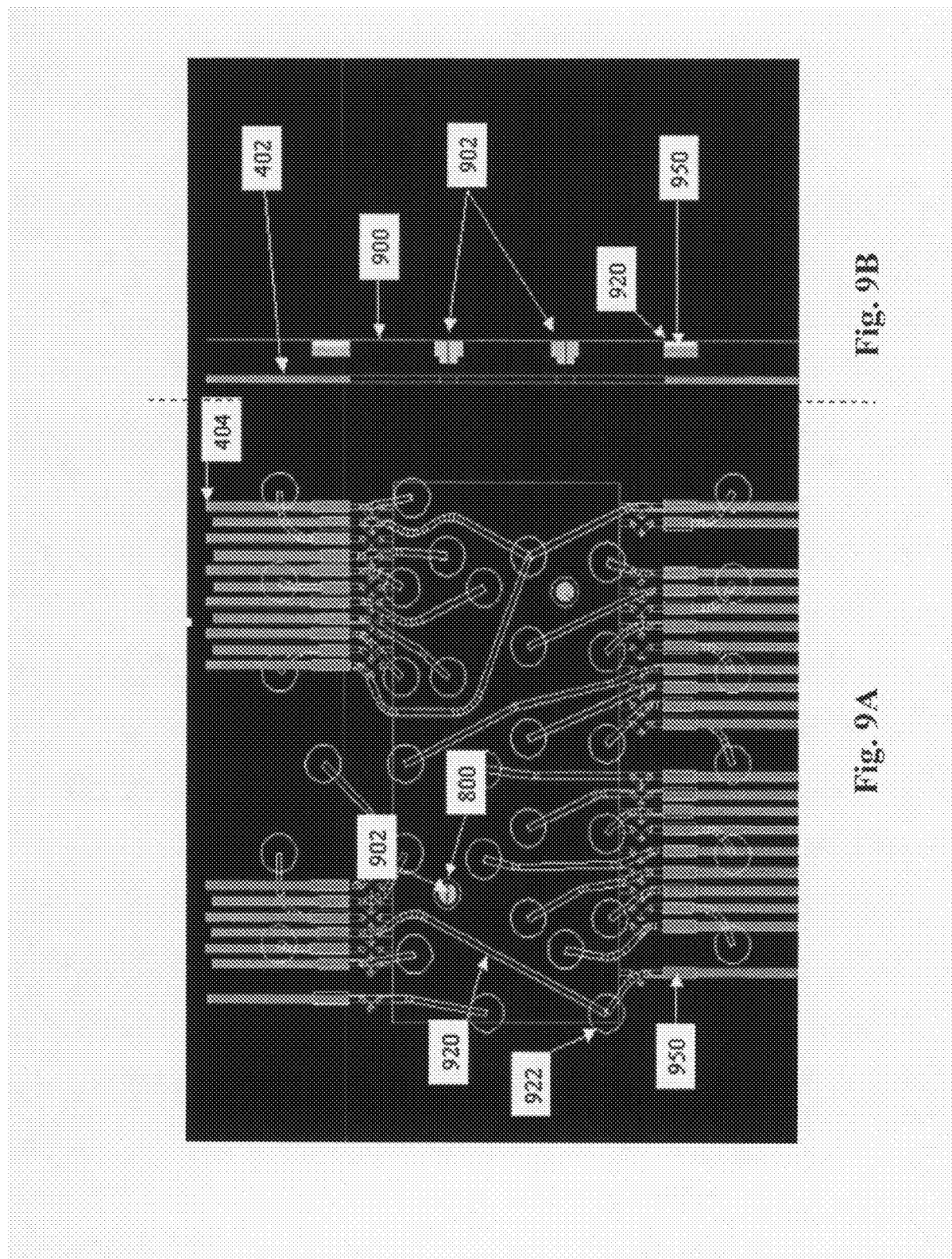

BEAM ASSEMBLY METHOD FOR LARGE AREA ARRAY MULTI-BEAM DUT PROBE CARDS

RELATED APPLICATION DATA AND CLAIM OF PRIORITY

This application claims the benefit of, and priority to, U.S. Provisional Patent Application No. 60/777,076, entitled BEAM ASSEMBLY METHOD FOR LARGE AREA ARRAY MULTI-BEAM DUT PROBE CARDS, filed Feb. 27, 2006, the contents of which are incorporated by reference for all purposes as if fully set forth herein.

FIELD OF THE INVENTION

This invention relates generally to the fabrication of probe elements for use in probe test cards.

BACKGROUND

As used herein, the term "beam DUT" refers to a series of beams configured to be included in a probe card, where the series of beams is of a number that corresponds to a respective series of conductive pads, areas or regions on a device to be tested or device under test (DUT) or the like.

In processes used to form probe cards, such as cantilever probe cards, thermal issues may arise due to the materials from which the probe cards are comprised. For example, the use of nickel manganese (NiMn) for probe elements in probe card fabrication may create thermal issues affecting alignment during attachment (such as by, for example, tab bonding using a wire bonder) of the probe beams to the corresponding posts on a substrate (e.g., a space transformer, a multi-layer organic (MLO) substrate, a multi-layer ceramic (MLC) substrate, a printed circuit board (PCB), etc.). Such alignment problems may result from the different coefficients of expansion (Cte) between the probe beam materials and the substrate materials which deleteriously affects accurate beam—post attachment/alignment and hence, formation of acceptable probe cards. Such issues may also exist when the beams are of a shape not utilizing a post (or other stand-off element), where the beams are bonded directly to the substrate pad (or conductive trace on the substrate).

BRIEF DESCRIPTION OF THE DRAWINGS

Embodiments of the invention are best understood from the following detailed description when read in connection with the accompanying drawing. It is emphasized that, according to common practice, the various features of the drawing are not to scale. On the. contrary, the dimensions of the various features are arbitrarily expanded or reduced for clarity. In the description, relative terms such as "horizontal," "vertical," "up," "down," "top," and "bottom" as well as derivatives thereof (for example, "horizontally," "downwardly," "upwardly," etc.) should be construed to refer to the orientation as then described or as depicted in the drawing figure under discussion unless otherwise specifically described. These relative terms are for convenience of description and normally are not intended to require a particular orientation. Terms "inwardly," "outwardly," "longitudinal" versus "lateral" and the like are to be interpreted relative to one another or relative to an axis of elongation, or an axis of center of rotation, as appropriate. Terms such as "connected" and "interconnected" refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. Included in the drawing are the following figures:

FIG. 4A is an enlarged view of a portion of quadrant Q3 of FIG. 3 depicting quadrant tie-bars and beam tie-bars according to one embodiment of the invention;

FIG. 7B is a view of quadrants Q1, Q4 and Q7 of FIG. 3 with quadrant Q1 having quadrant tie-bars and beam tie-bars and quadrants Q4 and Q7 having quadrant tie-bars, beam tie-bars, tip tie-bars and tail tie-bars according to one embodiment of the invention;

FIG. 7C is an enlarged view of the circled portion of quadrant Q4 of FIG. 7B depicting tip tie-bars between opposing groups of beams according to one embodiment of the invention;

FIG. 9A is an overhead plan view of a beam group (without certain quadrant tie-bars, beam tie-bars, tip tie-bars or tail tie-bars for ease of illustration) depicting alignment fiducials aligned over a structure having respective registration/alignment posts according to one embodiment of the invention;

FIG. 9B is side view of FIG. 9A;

DETAILED DESCRIPTION

According to one embodiment of the invention, a large beam panel is divided into smaller sub-panels before attachment of the beams to corresponding posts on a substrate (or before attachment of the beams directly to a conductive region of the substrate, without the posts), to reduce or eliminate the thermal issues that are otherwise associated with such a process. For smaller sized beam sub-panels there may be less of an overall expansion differential between the sub-panel and the corresponding substrate during processes conducted at relatively high temperatures which would cause expansion of the beams and substrate at different rates owing to their contrasting coefficients of expansion (Cte). According to one embodiment of the invention, beam panels are separated into, for example, one (1) to three (3) beam DUT sub-panels (i.e., sub-panels having the correct number of beams to test between one and three DUTs) before attachment of the beams on the beam sub-panel to corresponding posts on a substrate to minimize any thermal issues due to the smaller size of the beam sub-panels. For example, one to three beam DUT sub-panels may be used for certain NiMn based probe cards. For other material-based beam substrates a different number of beam DUT sub-panels may be employed such that any thermal issues, for example, are controlled or substantially eliminated. Further, by so subdividing the beam panel into smaller sub-panels in accordance with an embodiment of the invention, each individual beam may be made larger, that is, for example, more beams (and hence more probes) may be formed on each full beam panel.

According to another embodiment of the invention, the beam sub-panels may be aligned to the space transformer using alignment fiducials on the beam sub-panels that correspond to opposing alignment features formed in the space transformer or other substrate.

According to another embodiment of the invention, special tie-bars may be formed between: (1) rows, for example, of beams and the frame/frame splines (i.e., quadrant tie-bars); and (2) adjacent beams within any such rows on the beam panel (i.e., beam tie-bars), the beam panel may be separated into the selected beam sub-panels, and such separation may be made easier and more efficient.

According to yet another embodiment of the invention, beam alignment may be maintained and improved by forming tip tie-bars connecting adjacent beam tip ends within selected groups of beams and/or between adjacent groups of beams. Beam alignment may also be maintained and improved by forming tail tie-bars connecting adjacent beam tails within selected groups of beams.

Figure 1:
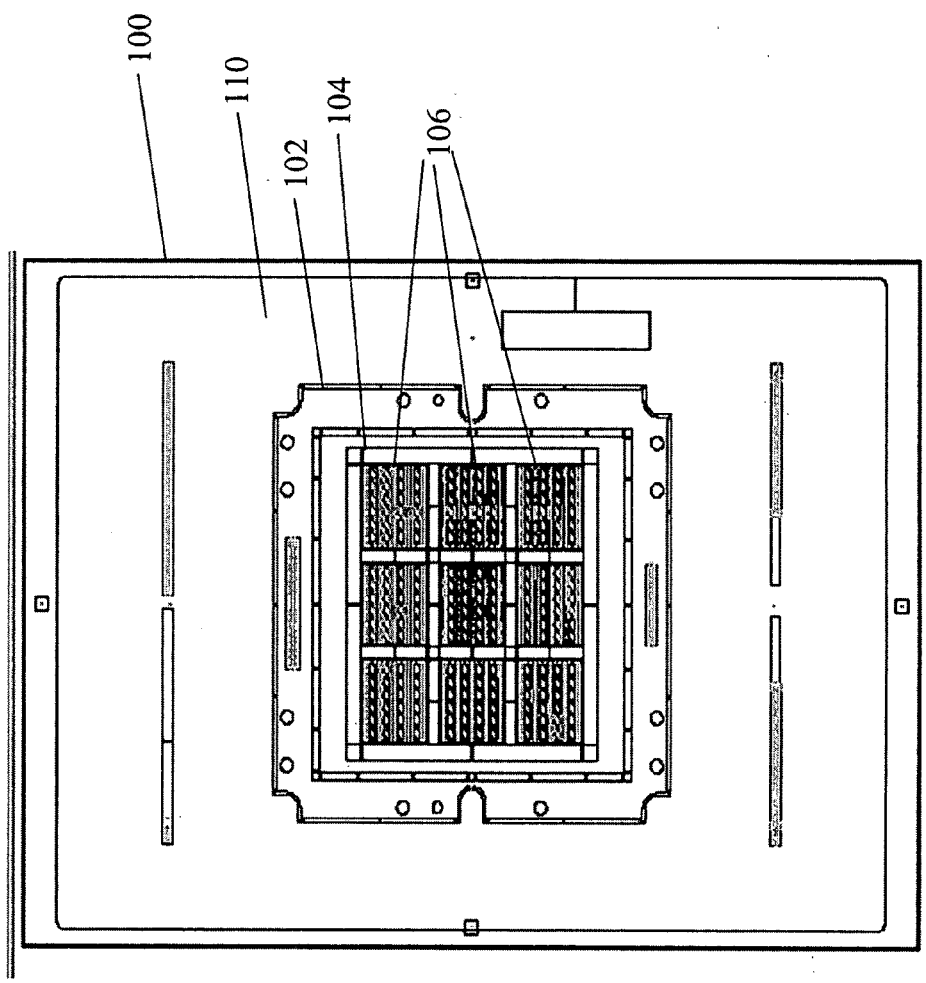
FIG. 1 is an overhead plan view of an example 9 panel, 24 DUT structure according to one embodiment of the invention.

As depicted in FIG. 1, according to one embodiment of the invention, a full 9 panel/quadrant 106 (with each quadrant 106 having beams for 24 DUTs, that is, beams for 24 devices to be tested, where each group of beams for a single DUT is labeled as 108 in FIG. 4A) is formed on structure 100 with each quadrant 106 having varying selections of quadrant tie-bars, beam tie-bars, tip tie-bars and/or tail tie-bars in accordance with embodiments of the invention. Each beam group 108 within each quadrant 106 may have, for example, from about 20 to 30 beams formed thereon, depending upon the number of DUT pads to be tested for a given device. For certain memory DUTs, 20-30 beams are utilized. Structure 100 may be, for example, a stainless steel substrate upon which the lithography and plating work (e.g., the plating of NiMn beams configured to be bonded to posts to form memory probe elements) may be performed. Other plating may be used, such as, for example, nickel cobalt (NiCo), Havar® (a high-strength non-magnetic cobalt based alloy and a registered trademark of Hamilton Precision Metals, Inc., 1780 Rohrerstown Road Lancaster Pa. 17601-2334), or beryllium copper (BeCu), amongst others.

The maximum outside boundary of beam panels 106 is depicted as element 102 and may represent a gap in the plating (e.g., the Ni-alloy plating of the beams) and may be, for example, a copper trace plated stainless steel area 102 between an inner section of Ni-alloy plated beam panels/quadrants 106 and an outer area of Ni-alloy plated/Cu plated/stainless steel 110. Beam panels/quadrants 106 may be connected to frame 104 (that may include vertical and horizontal splines, for example) which may also be Ni-alloy plated and may be used in plating operations for adjusting plating parameters and for ease of removal of the final (in this example embodiment) nine (9) beam panels/quadrants 106.

The 9 beam panels/quadrants 106 contained within frame 104 may be released from the structure 100 at Cu plated trace 102. That substructure defined by Cu plated trace 102 may then be further plated on both sides with, for example, gold (Au), for a subsequent tip forming process (e.g., a stud bumping process) to form tips that may be comprised of, for example, platinum iridium (PtIr), palladium (Pd) alloys, etc., on the upper surface of respective beam tip ends within each beam group 108. This gold plating also facilitates a tab bonding process using, for example, a wire bonder, to adhere the lower surface of respective beam tail ends of the tipped beams to posts formed on a structure (for example, a space transformer) to form the cantilever probes.

Figure 2:
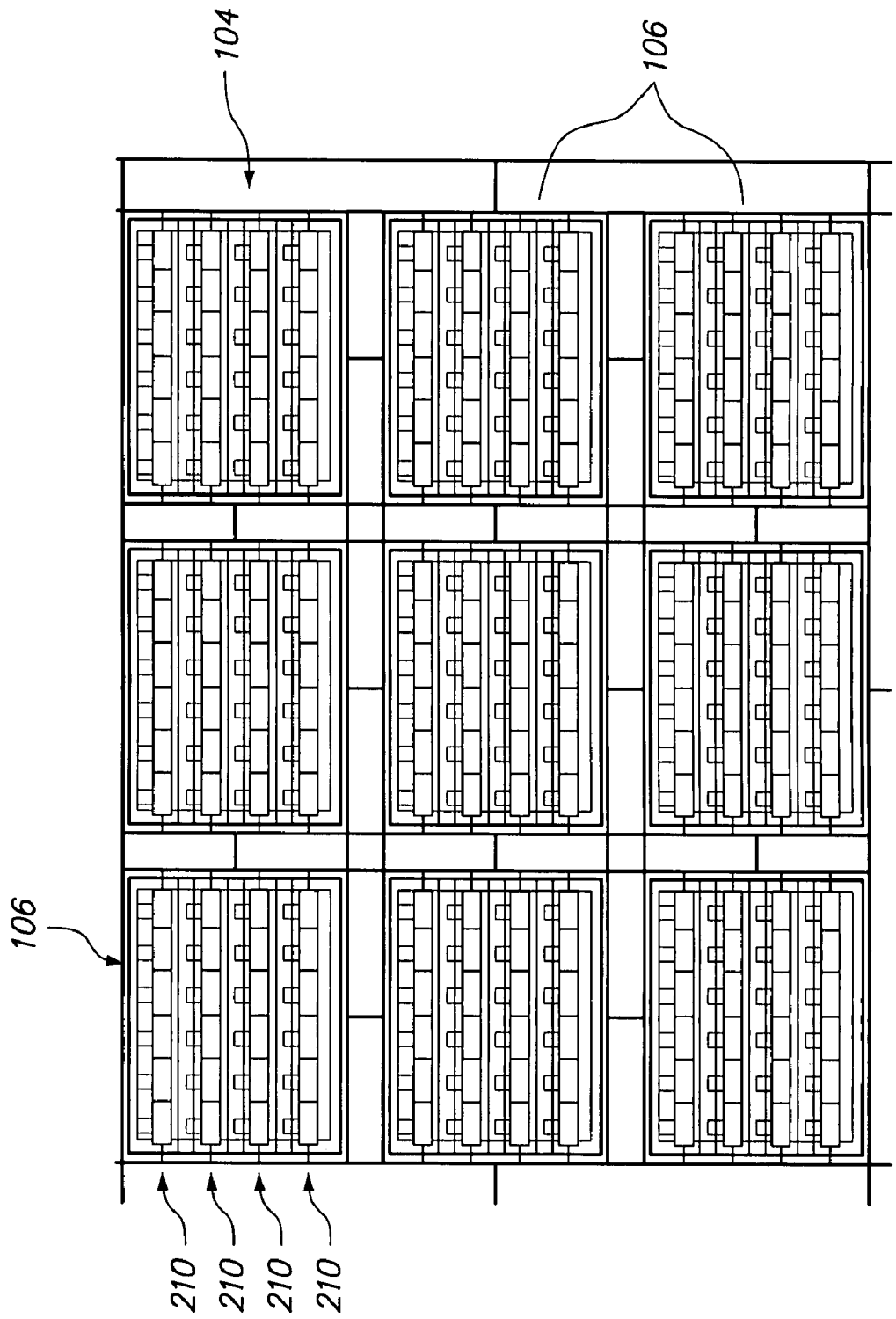
FIG. 2 is an enlarged view of a portion of FIG. 1.

FIG. 2 is an enlarged plan view of the 9 quadrants 106 of FIG. 1 within frame 104 with each quadrant 106 having, for example, 24 beam groups 108 (spaced, for example, in four rows of six beam DUTs each as depicted). Quadrant tie-bars 200 (described in further detail below, and depicted in, for example, FIG. 4A) attach rows 210 of beam groups 108 to frame/frame splines 104.

It is noted that the expression "tie-bars" in the accompanying figures generally refers to tip tie-bars 500 and tail tie-bars 600. This is because all quadrants 106 and sub-panels/sub-quadrants of beam group 108 may employ quadrant tie-bars 200 and beam tie-bars 400.

Figure 3:
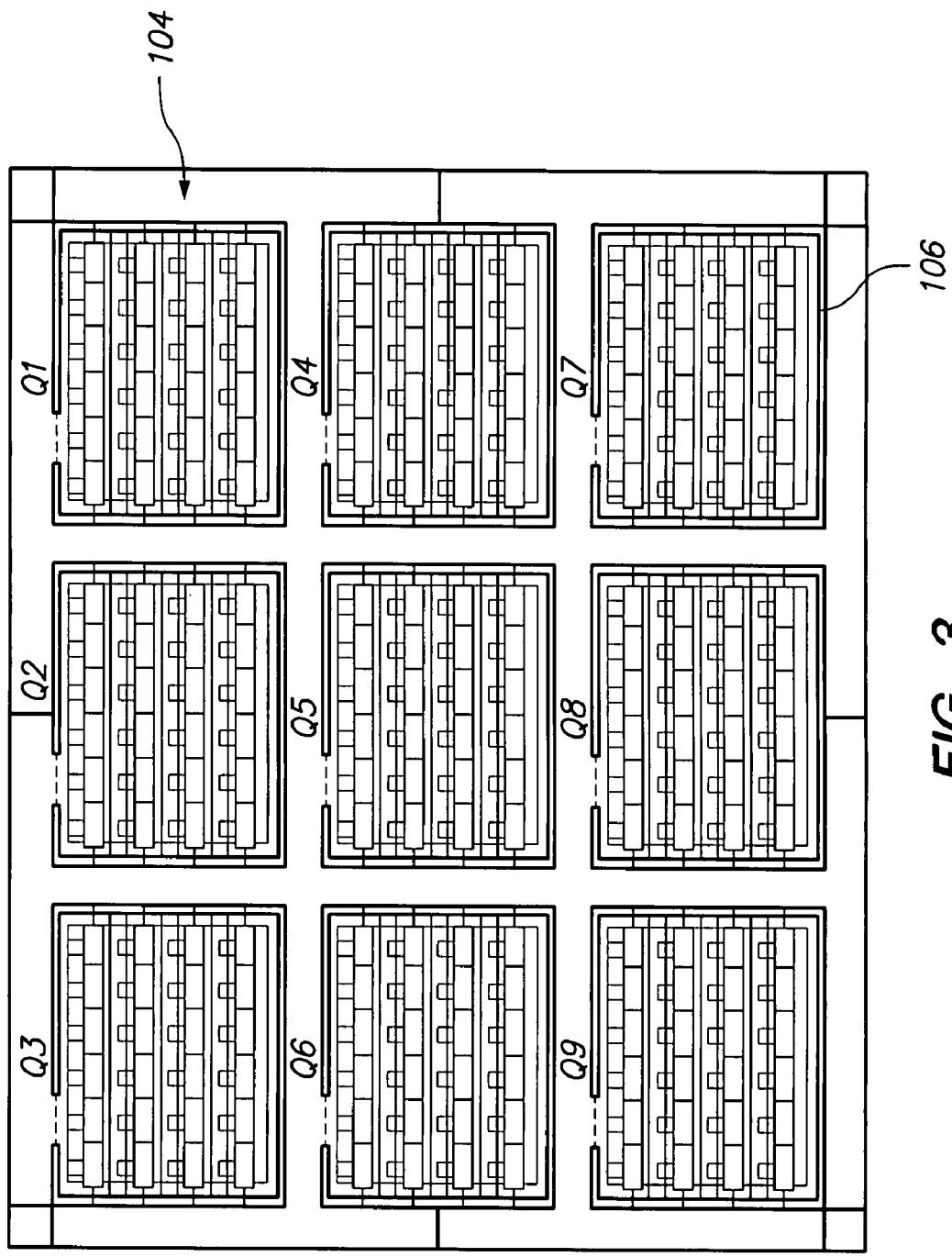
FIG. 3 is a schematic view of FIG. 2 having the 9 panels labeled Q1 through Q9, respectively.

FIG. 3 is a schematic plan view illustration of FIG. 2 with the 9 quadrants 106 designated as Q1 through Q9 within frame 104 and with each quadrant Q1 through Q9 comprising, for example, 24 beam groups 108 (where each beam group 108 represent beams for testing a single DUT). According to one embodiment of the invention: (1) quadrants Q1, Q2 and Q3 have only quadrant tie-bars 200 and beam tie-bars 400 (also see FIGS. 4A-4B, for example); quadrants Q4 and Q7 have quadrant tie-bars 200, beam tie-bars 400, tip tie-bars 500 and tail tie-bars 600 (also see FIG. 8, for example); quadrants Q5 and Q8 have quadrant tie-bars 200, beam tie-bars 400 and tip tie-bars 500 (also see FIG. 5, for example); and quadrants Q6 and Q9 have quadrant tie-bars 200, beam tie-bars 400 and tail tie-bars 600 (also see FIG. 6, for example). All 9 quadrants 106 Q1 through Q9 may be produced with the same selection/type of quadrant tie-bars 200, beam tie bars 400, tip tie-bars 500 and/or tail tie-bars 600 and any other combination desired.

Figure 4B:
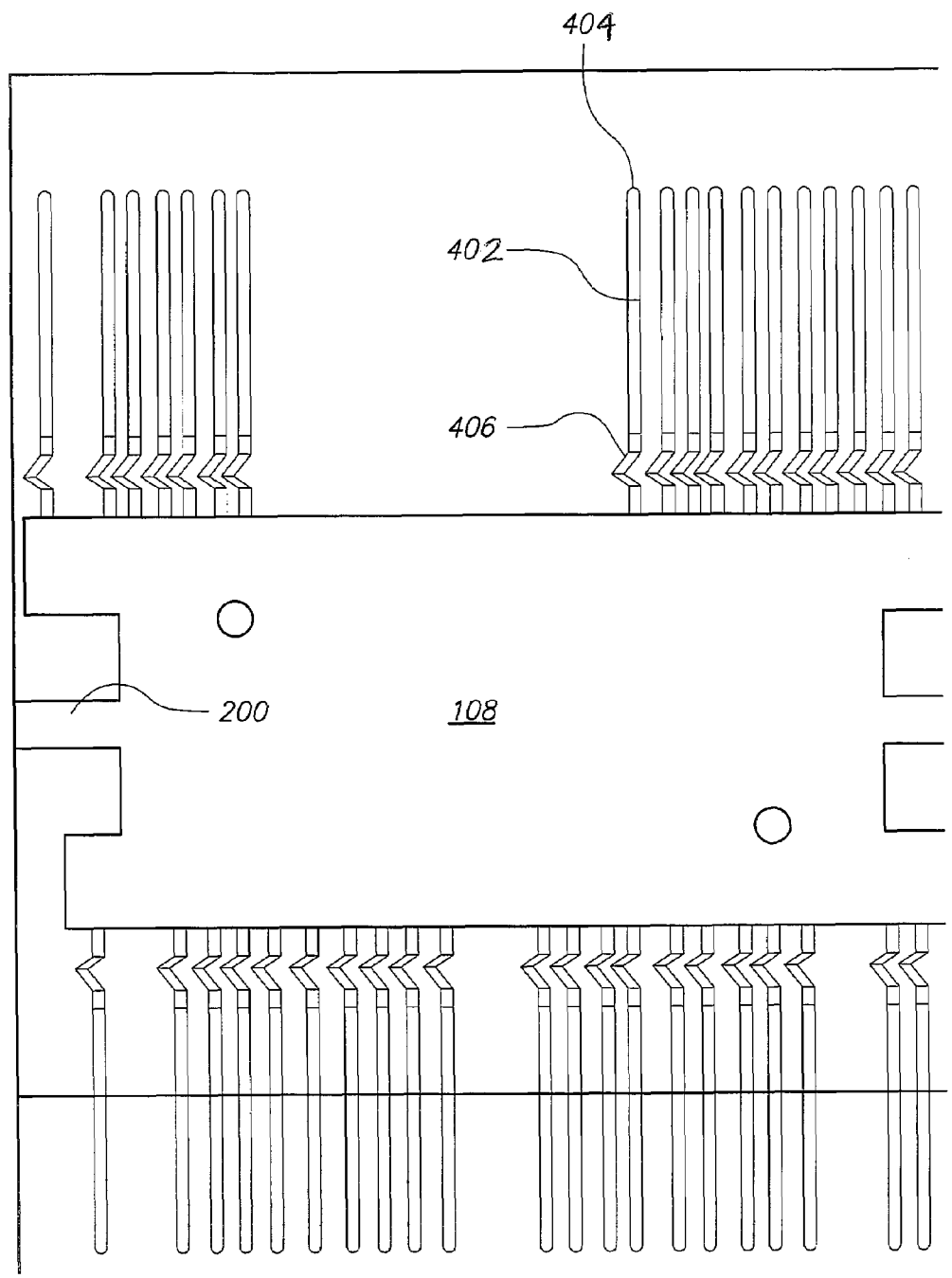
FIG. 4B is an enlarged portion of FIG. 4A corresponding to the upper left beam group 108.

FIG. 4A is an enlarged view of a portion of quadrant Q3 of FIG. 3 depicting: (1) quadrant tie-bars 200 formed according to one embodiment of the invention between quadrants 106 and frame/frame splines 104; and (2) beam DUT tie-bars 400 (labeled in FIG. 5 but visible in FIG. 4A) that are formed between adjacent beam groups 108 within rows 210. FIG. 4B is a detailed view of the upper left beam group 108 of FIG. 4A.

Each beam group 108 includes a series of beams 402 having respective tip ends 404 and tail ends 406. That is, each beam group 108 comprises a series of beams 402 that correspond to a respective series of conductive pads, areas or regions on a device to be tested (or a device under test (DUT)) to be contacted by the beams 402 (more specifically, to be contacted by tips of the beams 402).

The formation of: (1) quadrant tie-bars 200 between: (a) quadrants 106 and frame/frame splines 104 may assist in easily and efficiently separating quadrants 106 from frame 104 (e.g., into individual rows 210 of beam groups 108); and (2) beam tie-bars 400 between adjacent beam groups 108 within rows 210 may assist in easily and efficiently subdividing each row 210 of beam groups 108 into sub-panels/sub-quadrants having a further lesser number of beam groups 108. For example, in one embodiment of the invention, quadrant Q3 (depicted having 24 beam groups 108 of 4 rows of 6 beam groups 108 each) may be subdivided into from twenty four 1 to eight 3 beam group sub-panels or any combination thereof. The quadrants 106 may be subdivided into more beam groups 108 than 1 to 3 beam groups 108 per sub-panel/sub-quadrant depending upon the materials employed and the subsequent processes to be utilized or for other constraints/optimizations. This subdivision of the quadrants 106 into sub-panels/sub-quadrants may minimize and/or substantially eliminate, for example, any thermal issues otherwise arising from further processing as described below.

According to one embodiment of the invention, each quadrant 106 may have rows 210 of only from, for example, 1 to 3 beam groups 108, such that separation of each quadrant 106 from frame 104 by quadrant tie-bars 200 may, in an of itself, form the desired 1 to 3 beam group 108 sub-quadrants. Of course, if more beam groups 108 per sub-quadrant were desired, such as for example, 4 beam groups 108 per sub-panel, then each quadrant 106 could be comprised of rows 210 of 4 beam groups 108 such that separation of each quadrant 106 from frame 104 by quadrant tie-bars 200 would yield the desired sub-panels of beam groups 108. Quadrants Q1, Q2 and Q4 through Q8 may also have quadrant tie-bars 200 and beam DUT tie-bars 400.

Figure 5:
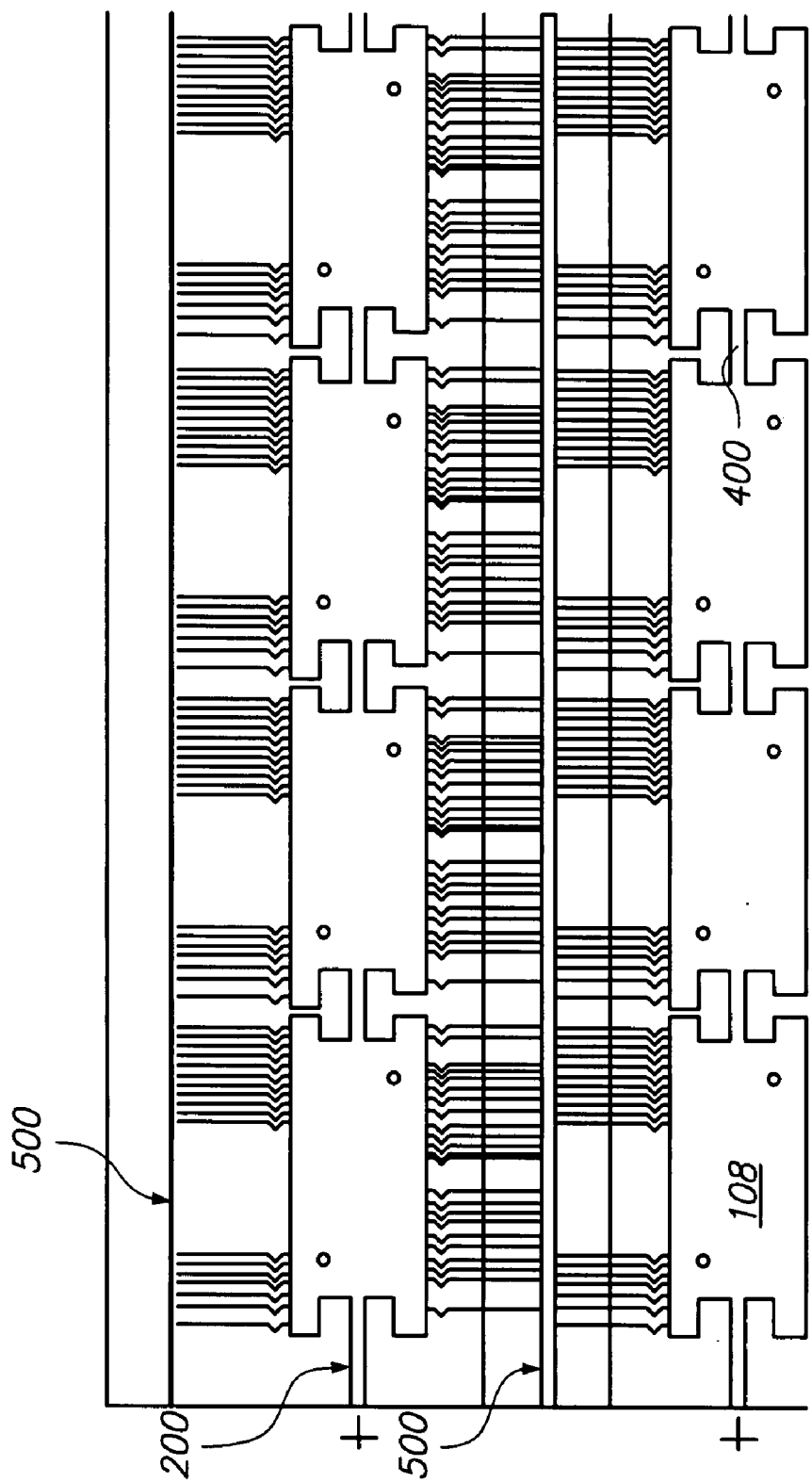
FIG. 5 is an enlarged view of quadrant Q5 of FIG. 3 depicting quadrant tie-bars, beam tie-bars and tip tie-bars according to one embodiment of the invention.

FIG. 5 is an enlarged view of a portion of quadrant (106) Q5 of FIG. 3 depicting tip tie-bars 500 formed between adjacent beam tip ends 404 within rows 210 of beam groups 108. As depicted, tip tie-bars 500 also connect to frame 104 at either end thereof. Tip tie-bars 500 may assist in maintaining alignment of beams 402/beam tip ends 404 during the separation of rows 210 from frame 104 within each quadrant 106, and during the further processing and other handling in formation of the probe cards. Tip tie-bars 500 may be comprised of the same material as the beams 402 themselves (e.g., during plating of the beams the tie bars disclosed herein, including tip tie bars 500, may be plated as well).

Tip tie-bars 500 may be formed such that they provide support to tip ends 404 of beams 402 during processing and handling in the formation of the probe cards (e.g., when separating the rows 210 of beam groups 108 from frame 104 and/or further separating the rows 210 of beam groups into the desired sub-panels of beam groups 108 and/or adhering tail ends 406 to posts 950 (see FIGS. 9A and 9B, for example)), and they may be relatively easily separated/removed from beam tip ends 404 when desired (e.g., after adhering tail ends 406 to posts 950) without unduly stressing the tip ends 404/beams 402.

FIG. 7C is an enlarged view of portion "7C" of FIG. 7B depicting an example construction of tip tie-bars 500 formed in quadrant Q4 between opposing beam groups 108. Specifically, as depicted in FIG. 7C, each tip tie-bar 500 comprises: (1) a longitudinal portion 502 generally perpendicular to adjacent beams 402 and which extends between portions of frame 104 and between adjacent beam groups 108 in rows 210 (not depicted in FIG. 7C); and (2) tab portions 504 extending from longitudinal portion 502 to respective tip ends 404 of beams 402. Tab portions 504 may taper as they connect to tip ends 404 for easier separation of tip tie-bar 500 from beam tip ends 404 when desired. Quadrant Q5 (and Q4, Q7 and Q8 of FIG. 3, for example)) may also have quadrant tie-bars 200 and beam tie-bars 400.

Figure 6:
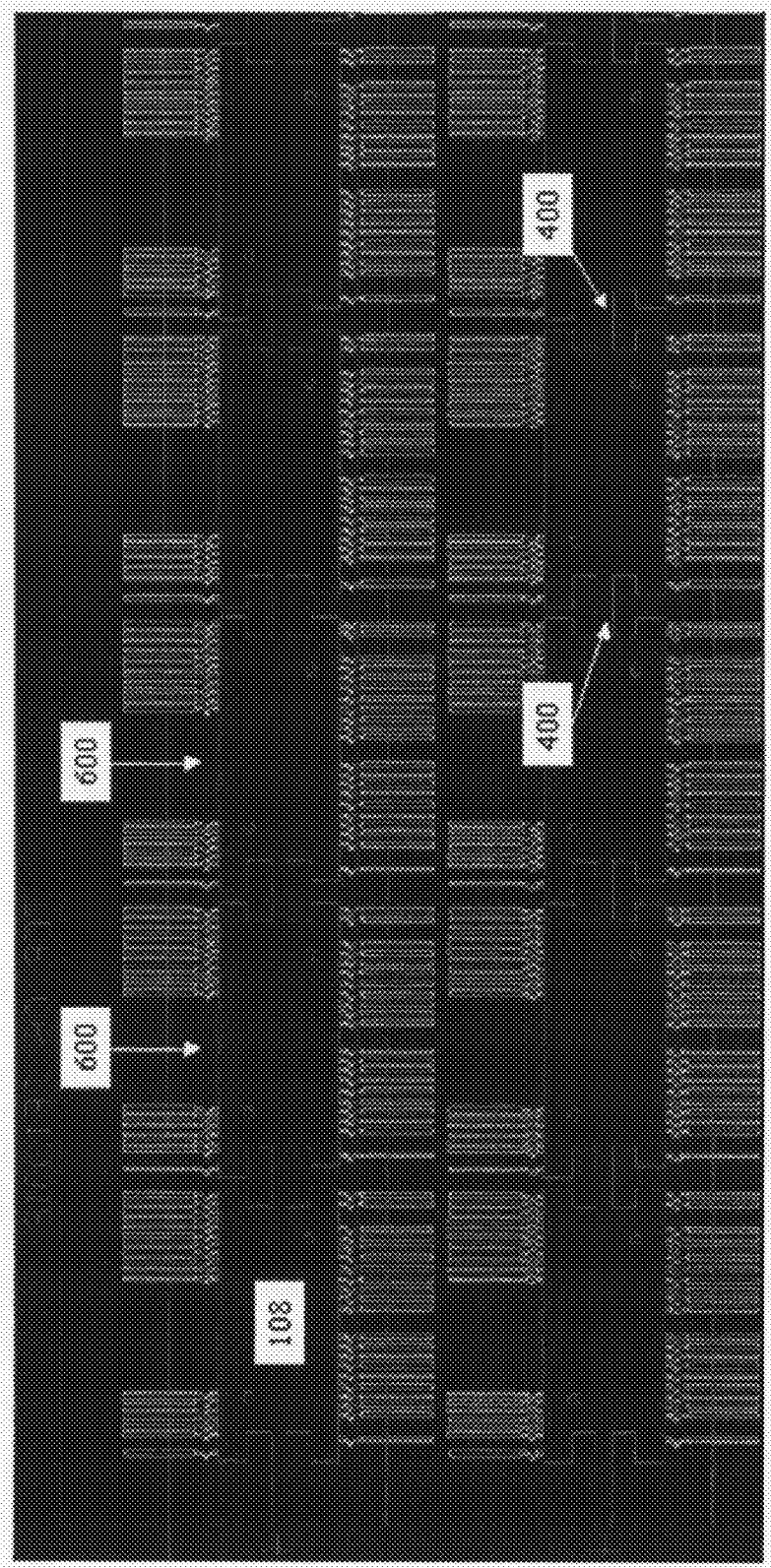
FIG. 6 is an enlarged view of quadrant Q6 of FIG. 3 depicting quadrant tie-bars, beam tie-bars and tail tie-bars according to one embodiment of the invention;.

FIG. 6 is an enlarged view/illustration of a portion of quadrant (106) Q6 of FIG. 3 depicting tail tie-bars 600 formed between adjacent beam tail ends 406 of beams 402 within each beam group 108. It is noted that as depicted in FIG. 6, tail tie-bars 600 do not extend between adjacent beam groups 108 nor to frame 104 although they may. Tail tie-bars 600 may assist in maintaining alignment of beams 402/beam tail ends 406 during the separation of rows 210 from frame 104, and/or in the further processing and other handling in formation of the probe cards. Tail tie-bars 600 may be comprised of the same material as the beams 402 themselves (e.g., during plating of the beams the tie bars disclosed herein, including tail tie-bars 600, may be plated as well).

Tail tie-bars 600 may be formed such that they provide support to the tail ends 406 of beams 402 during processing and handling in the formation of the probe cards (for example when separating the rows 210 of beam groups 108 from frame 104 and/or further separating the rows 210 of beam groups into the desired sub-panels of beam groups 108 and/or adhering tail ends 406 to posts 950 (see FIGS. 9A and 9B, for example)) and they may be relatively easily separated/removed from beam tail ends 406 when desired (e.g., after adhering tail ends 406 to posts 950) without unduly stressing the tail ends 406/beams 402.

Figure 7A:
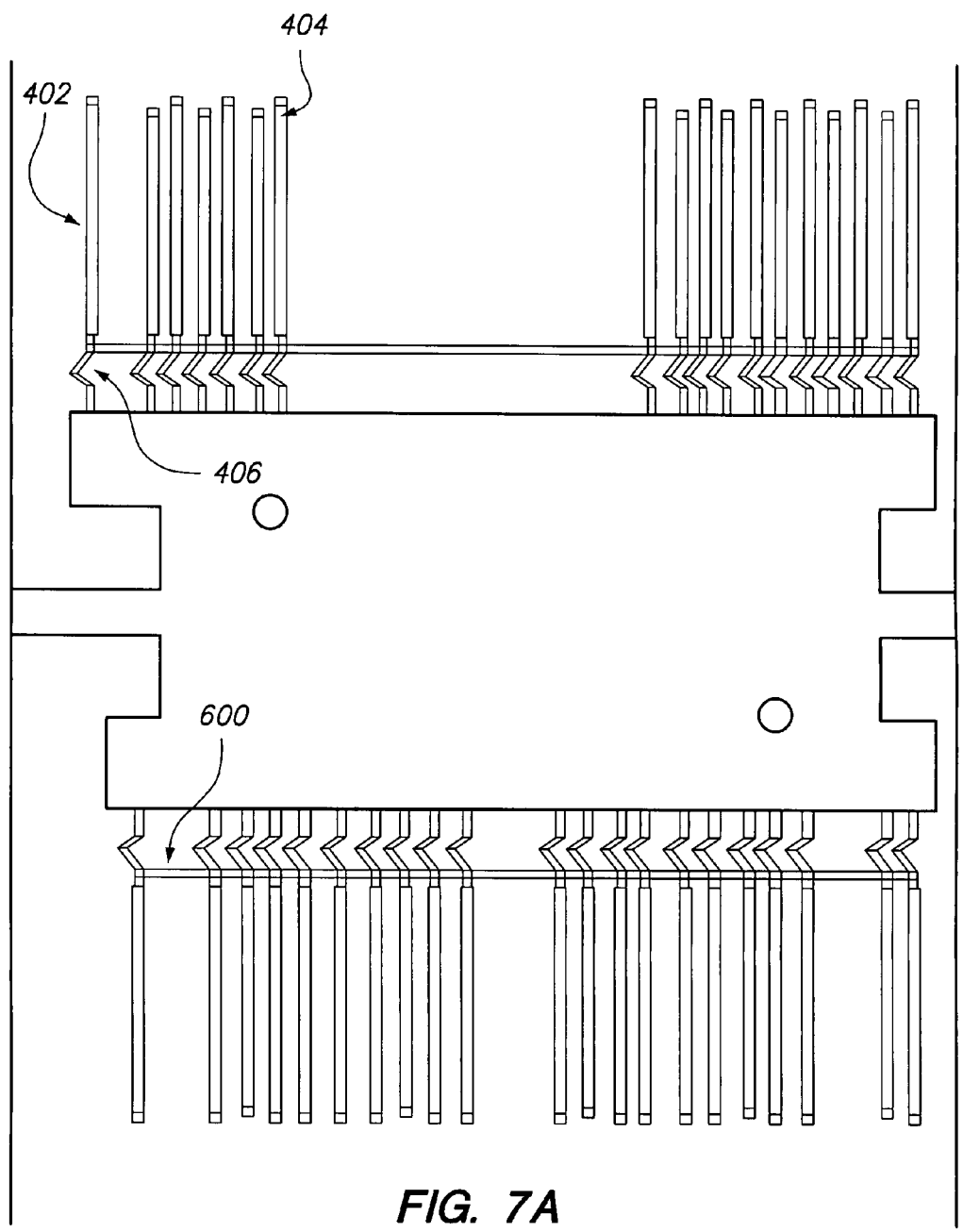
FIG. 7A is an enlarged view of the upper left-hand beam group of FIG. 6 depicting a quadrant tie-bar, a beam tie-bar and tail tie-bars.

FIG. 7A is an enlarged view of the upper left-hand beam group 108 of FIG. 6 that may more clearly shows tail tie-bars 600 in connection with tail ends 406 of beams 402.

Figure 8:
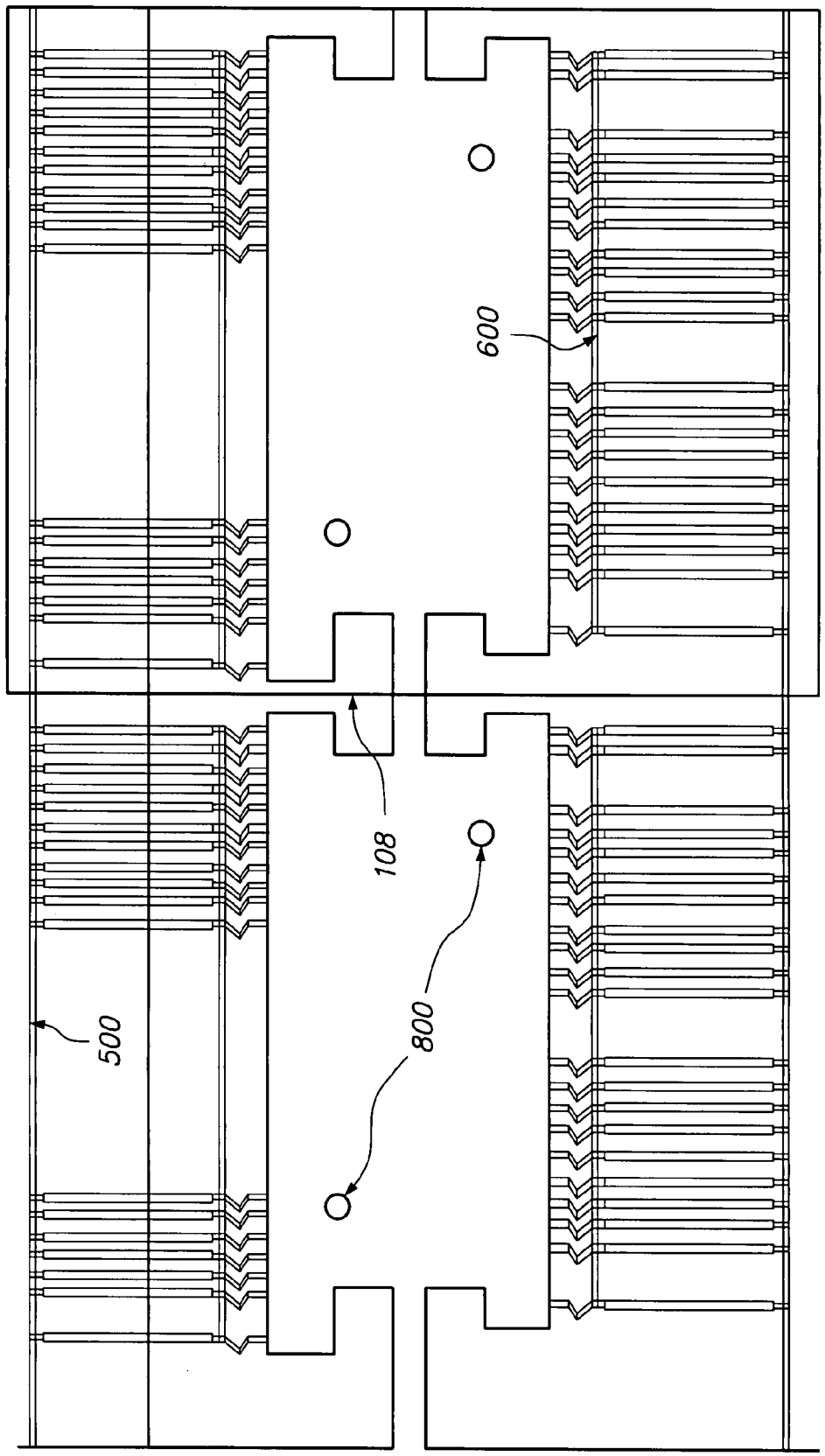
FIG. 8 is an enlarged view of a portion of either quadrant Q4 or Q7 depicting quadrant tie-bars, beam tie-bars, tip tie-bars and tail tie-bars according to one embodiment of the invention.

FIG. 8 is an enlarged view of a portion of either quadrant (106) Q4 or Q7 of FIG. 3 depicting: (1) quadrant tie-bar 200 connecting row 210 of beam groups 108 to frame 104 (quadrant tie bar is visible, but not labeled in FIG. 8, but is labeled in FIG. 5); (2) beam tie-bars 400 connecting adjacent beam groups 108 within row 210 (beam tie-bars 400 are visible, but not labeled in FIG. 8, but are labeled in FIG. 6); (3) tip tie-bars 500 formed between adjacent beam tip ends 404 within rows 210 of beam groups 108 (also see FIG. 5, for example); and (4) tail tie-bars 600 formed between adjacent beam tail ends 406 of beam groups 108 (also see FIG. 6, for example). Thus, quadrant tie-bars 200, beam tie-bars 400, tip tie-bars 500 and/or tail tie-bars 600 may be formed in any combination within a quadrant 106.

FIG. 8 also shows fiducials 800 that may be formed within each beam group 108 and which may be used to align beam group 108/beams 402 with a structure having posts formed thereon corresponding to the series of beams 402 so that beam tail ends 406 may be affixed to the posts to form cantilever probes for a probe card. Fiducials 800 may be, for example, apertures defined through the base material of beam group 108 adapted to receive a alignment post 902 (see FIGS. 9A and 9B, for example) provided on a substrate 900 (see FIGS. 9A, 9B, 10A and 10B, for example). This interconnection may assist in properly aligning beam groups 108 (or a sub-panel of beam groups 108) with substrate 900. While two fiducials 800 are depicted, more (or less) fiducials per beam group 108 may be employed and further, for multi-beam group 108 sub-panels, a single fiducial 800 may be employed per beam group 108 within each sub-panel so that preferably at least two sub-panel fiducials align with respective registration posts.

FIG. 9A is an overhead plan view of a beam group 108 (without any quadrant tie-bars 200, beam tie-bars 400, tip tie-bars 500 or tail tie-bars 600 for ease of illustration) and FIG. 9B is a right (or left) hand side view of FIG. 9A with each of FIGS. 9A-9B depicting alignment fiducials 800 aligned over, and spaced apart from, substrate 900 having respective alignment posts 902 formed according to an embodiment of the invention. Substrate 900 may comprise of, for example: ceramic such as alumina; $Al_2O_3$; silicon nitride ($Si_3N_4$); silicon aluminum oxynitride (SiAlON); aluminum nitride (AlN) or any other substrate material. As depicted in FIG. 9B, registration posts 902 may have a height greater than the height of posts 950 and may be formed by, for example, a stud bumping or a plating process, etc.

Alignment of alignment fiducials 800 and respective registration posts 902 facilitates alignment of beam tail ends 406 within beam group 108 to respective posts 950 on substrate 900 to bonding of the lower side of beam tail ends 406 to respective posts 950 to form cantilever probes (which may have tips on the upper surface of beam tip ends 404). Beam tail ends 406 may then be adhered to posts 950 by, for example, using a tab bonding process with a wire bonder. It is noted that the under surface of beam tail ends 406 and the upper surface of posts 950 may have a bondable metallization material thereon such as, for example, gold (Au).

Electrically conductive traces 920 connected at a distal end to conductive vias 922 may connect respective posts 950 to other portions within substrate 900, which may be, for example, a space transformer and may also be a PCB, MLO, MLC, etc.

Figures 10A, 10B:
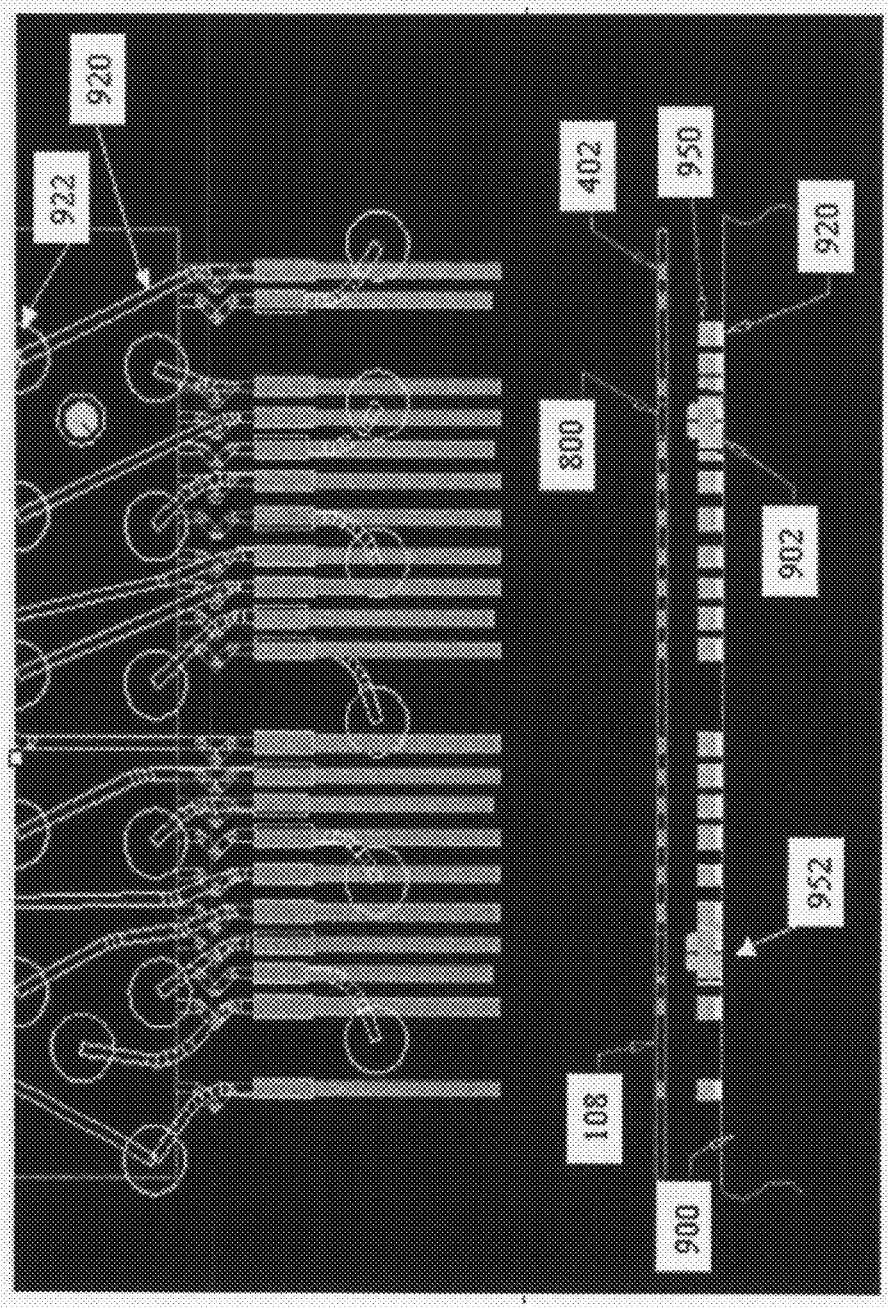
FIG. 10A is an overhead plan view of the lower portion of FIG. 9A (without certain quadrant tie-bars, beam tie-bars, tip tie-bars or tail tie-bars for ease of illustration) depicting an alignment fiducial aligned over a structure having a respective registration/alignment post.
FIG. 10B is a side view of FIG. 10A depicting both alignment fiducials and respective registration/alignment posts.

FIG. 10A is an overhead plan view of the lower portion of FIG. 9A (again without any quadrant tie-bars 200, beam DUT tie-bars 400, tip tie-bars 500 or tail tie-bars 600 for ease of illustration). FIG. 10B is a top or bottom side view of FIG. IOA and more clearly shows the alignment of beam tail ends 406 with respective posts 950 upon alignment of posts 902 with fiducials 800 about respective vertical alignment axes 952.

After aligned beam tail ends 406 are affixed to respective posts 950 (by, for example a tab bonding process using a wire bonder), any remaining tail tie-bars 600 and tip tie-bars 500 may be removed from beams 402 by, for example, dicing, cutting, saw cutting, laser cutting, or any other appropriate method. Any tail tie-bars 600 and/or tip tie-bars 500 may be so removed in any order, that is, one may remove tail tie-bars 600 and then remove tip tie-bars 500 or one may remove tip tie-bars 500 and then remove tail tie-bars 600.

According to one embodiment of the invention for NiMn beam groups 108, for example, each quadrant 106 of FIG. 1 may first be separated from frame 104 cutting along the horizontal and vertical splines of frame 104. Thus, the 9 quadrant structure within frame 104 is separated into 9 separate 24-beam (6×4) DUT quadrants 106 for further processing. Cantilever tips (not depicted) may be affixed to the upper surfaces of respective beam tip ends 402 within each row 210 of quadrant 106. Then, before the high temperature tab bonding process, each tipped row 210 of beam groups 108 within quadrant 106 may be separated into 1 to 3, for example, beam group 108 sub-panels by cutting (such as, for example, laser cutting, electrode cutting, saw cutting, etc.): (1) quadrant tie-beams 200 between rows 210 and frame 104; and (2) beam tie-bars 400 between adjacent beam groups 108 (as necessary).

The 1 to 3 beam group 108 sub-panels/sub-quadrants may then be loaded onto a substrate using respective alignment fiducials 800 and registration posts 902 to achieve proper alignment there between. This achieves proper alignment of the beam tail ends 406 to posts 950 on substrate 900 so that they may be adhered together. The use of smaller beam group 108 sub-panels may minimize or substantially eliminate the thermal issues due to thermal mismatch between the beam group 108 material and substrate 900 material at the temperatures used to adhere beam tail ends 406 to posts 950 as the smaller sub-panels decreases the effect of any such thermal mismatch as compared to quadrant 106/rows 210 (or even larger groups) as a whole. Any remaining tip tie-bars 500 and/or tail tie-bars 600 may then be removed (in any sequence) to complete formation of the cantilever probes/probe cards.

Quadrant tie-bars 200 and/or beam tie-bars 400 may serve to facilitate separation of multi-beam DUT quadrants 106 into smaller sub-panels/sub-quadrants of beam groups 108 which may: (1) minimize/eliminate any thermal effects otherwise encountered during processing; and (2) permit formation of larger individual beam groups 108 (i.e., the ability to have more beams 402 per beam group 108).

Tail tie-bars 600 and/or tip tie-bars 500 may serve to maintain alignment of beams 402 throughout the processing and reduces the need to repair/realign beams 402 especially as to any lateral misalignment to a point of reference. Tail tie-bars 600 and/or tip tie-bars 500 may also serve minimize/substantially eliminate breakage of any beams 402 during processing or assembly of the probe. Tip tie bars, in addition, will help in the tip formation process (e.g., by stud bumping) by making the probes more robust & rigid.

The approaches described herein may be embodied in other specific forms without departing from the spirit or essential attributes thereof. Although particular embodiments of the invention have been described and depicted herein, it should be understood by those skilled in the art that the foregoing and various other changes, omissions and additions may be made therein and thereto, without parting from the spirit and scope of the present invention.

What is claimed is:

1. A method for fabricating beams for a probe card, the method comprising:
   dividing a beam panel that comprises a plurality of beams into a plurality of quadrants, wherein each quadrant from the plurality of quadrants includes a plurality of beam groups and wherein each beam group from each plurality of beam groups is associated with a device under test and includes a plurality of beams;
   forming a plurality of quadrant tie bars to join each quadrant from the plurality of quadrants to a frame of a support structure;
   for at least one quadrant from the plurality of quadrants, forming a plurality of beam tie bars to join two or more adjacent beam groups within a row of the at least one quadrant; and
   for at least a particular beam group from any of the plurality of quadrants, forming a tie bar that joins two or more beams within the particular beam group.

2. The method as recited in claim 1, wherein the tie bar also joins the two or more beams to the frame of the support structure.

3. The method as recited in claim 1, wherein:
   each beam from the two or more beams within the particular beam group includes a tip end and a tail end, and
   forming a tie bar that joins two or more beams within the particular beam group includes forming a tail tie bar that connects the tail ends of the two or more beams within the particular beam group.

4. The method as recited in claims 1, wherein:
   each beam from the two or more beams within the particular beam group includes a tip end and a tail end, and
   forming a tie bar that joins two or more beams within the particular beam group includes forming a tip tie bar that connects the tip ends of the two or more beams within the particular beam group.

5. The method as recited in claim 4, wherein the tip tie bar includes one or more tab portions connected to the tip ends of the two or more beams and a longitudinal portion connected to the one or more tab portions.

6. The method as recited in claim 5, wherein the one or more tab portions are tapered at the point where they connect to the longitudinal portion.

7. The method as recited in claim 4, wherein the tip tie bar connects a particular beam to the frame of the support structure, wherein the particular beam is an end beam in a beam group, from the two or more adjacent beam groups, that is closest to the support structure.

8. The method as recited in claim 1, wherein:
each beam in the two or more adjacent beam groups within the row of the at least one quadrant includes a tip end and a tail end, and
the plurality of beam tie bars includes a plurality of tip tie bars to connect the tip ends of the beams in the two or more adjacent beam groups within the row of the at least one quadrant.

9. The method as recited in claims 8, wherein each tip tie bar from the plurality of tip tie bars includes one or more tab portions connected to the tip ends of the beams and a longitudinal portion connected to the one or more tab portions.

10. The method as recited in claim 9, wherein the one or more tab portions are tapered at the point where they connect to the longitudinal portion.

11. The method as recited in claim 8, wherein the plurality of tip tie bars includes a particular tip tie bar that connects a particular beam to the frame of the support structure, wherein the particular beam is an end beam in a beam group, from the two or more adjacent beam groups, that is closest to the support structure.

12. The method as recited in claim 1, wherein the plurality of quadrant tie bars, the plurality of beam tie bars and the plurality of beams are made from substantially the same material.

13. The method as recited in claim 1, wherein the plurality of quadrant tie bars and the plurality of beam tie bars are made from a material that is different than the material of the plurality of beams.

14. The method as recited in claim 1, further comprising forming one or more alignment fiducials associated with a particular beam group to aid in aligning a set of posts to the particular beam group during a subsequent processing step.

15. The method as recited in claim 14, wherein the one or more alignment fiducials are one or more alignment holes configured to mate with one or more alignment posts on a substrate that carries the set of posts.

16. The method as recited in claim 1, further comprising:
aligning the plurality of beams to a plurality of posts on a substrate;
bonding the plurality of beams to the plurality of posts; and
after bonding the plurality of beams to the plurality of posts, removing both the plurality of quadrant tie bars and the plurality of beam tie bars.

17. The method as recited in claim 1, further comprising:
removing the plurality of quadrant tie bars to allow each quadrant from the plurality of quadrants to be individually removed from the support structure;
aligning the plurality of beams in each quadrant to a corresponding plurality of posts on one or more substrates;
bonding the plurality of beams in each quadrant to the corresponding plurality of posts on the one or more substrates; and
after bonding the plurality of beams in each quadrant to the corresponding plurality of posts on the one or more substrates, removing the plurality of beam tie bars.

* * * * *